United States Patent
Tsay et al.

(12)

(10) Patent No.: US 6,318,946 B1
(45) Date of Patent: Nov. 20, 2001

(54) INTERLOCK SYSTEM FOR SEMICONDUCTOR WAFER TRANSPORT APPARATUS

(75) Inventors: Yuh-Dean Tsay, Ping-Tung; Shih-Chieh Liao, Non-Tou; Li-Ren Lin; Wen-Yao Chen, both of Hsin-Chu, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/283,064

(22) Filed: Mar. 31, 1999

(51) Int. Cl.[7] ....................................................... B65H 1/00
(52) U.S. Cl. ............................. 414/222.01; 198/341.01; 198/464.3; 198/575; 414/940
(58) Field of Search ...................................... 414/217, 416, 414/939, 940, 222.01; 198/464.3, 341.01, 575; 901/49, 50; 340/960

(56) References Cited

U.S. PATENT DOCUMENTS

| | | | |
|---|---|---|---|
| 4,697,979 | * 10/1987 | Nakashima et al. | ............... 901/49 X |
| 5,242,045 | * 9/1993 | Kakida et al. | ................ 198/464.3 X |
| 5,859,598 | * 1/1999 | Wade | .................................... 340/960 |
| 5,947,675 | * 9/1999 | Matsushima | ..................... 414/940 X |

* cited by examiner

Primary Examiner—Donald W. Underwood
(74) Attorney, Agent, or Firm—Tung & Associates

(57) ABSTRACT

An interlock system prevents collision of handling equipment and damage to wafers in an automated wafer transport apparatus during manual control by an operator. Sensors are used to sense when wafer transport arms and wafer stage are both in their home positions. A controller is responsive to the sensors for operating the lockout system such that attempted activation of the transport arm by the operator is locked out unless both the stage and the arms are in their home positions. The lockout system preferably comprises normally closed electrical relays.

8 Claims, 2 Drawing Sheets

INTERLOCK SYSTEM FOR SEMICONDUCTOR WAFER TRANSPORT APPARATUS

TECHNICAL FIELD

The present invention broadly relates to semiconductor wafer transport apparatus, and deals more particularly with an interlock system which prevents collision of handling equipment and damage to wafers when the equipment is operated in a manual mode by an operator.

BACKGROUND OF THE INVENTION

The high level of automation used in fabricating semiconductor devices relies on sophisticated handling and transport equipment for moving semiconductor wafers between various processing stations. Most handling and transport operations are conducted under automatic control using a programmable logic controller, or other programmed computer which issues control signals for operating the equipment with little or no intervention by an operator. Nevertheless, there are certain situations where operator intervention becomes necessary, consequently the automated wafer handling equipment mentioned above normally includes a series of manual controls that permit the operator to separately control each stage of movement of the wafers. By way of example, standard mechanical interface (SMIF) pods are used to transport a number of wafers which are typically stored in cassettes. The SMIF pod normally includes robotically operated arms that transport wafer cassettes to a stage from which the cassette is in turn automatically transported to another area, or into processing equipment, such as a deposition chamber.

The transport of the wafer-carrying cassette just described is normally carried out completely automatically, without operator intervention. However, the control system for the handling equipment normally has an off-line mode of operation that can be used by an operator to individually control movements of the transport, which might be required during the initial set up of the equipment in preparation for processing a batch of wafers, or to either clean the equipment or test it to ensure that the movements are smooth and accurate. Because the SMIF pod, the transport arms and the stage are all capable of moving in various directions, the possibility exists that a collision may occur between these elements if the operator does not properly operate the manual controls, and in the proper sequence of control movements. For example, the SMIF arm could be actuated so as to attempt to move a cassette onto a stage before a previously placed cassette could be removed from the stage, thus resulting in a collision that could easily damage or destroy wafers and/or the handling equipment. Up to the present time, there have been no means provided for avoiding such collisions of equipment and resultant damage to wafers. Consequently, many wafers and transport equipment are damaged in this manner, causing undesirable down time as well as reduced manufacturing throughput.

It may thus be appreciated that there is a clear need in the art for a safety interlock system, which overcomes each of the deficiencies described above, and prevents damage to wafers and handling equipment when the equipment is under manual control by an operator.

SUMMARY OF THE INVENTION

The present invention provides an interlock system for automatic handling and transport equipment used to fabricate semiconductor devices, such as wafers. The system employs a series of sensors to sense the current condition or position of either wafer cassettes or elements of the transport mechanism. Depending upon the status and position of the cassette and transport elements, manually operable controls are selectively disabled or "locked out" where activation thereof by an operator would result in collision of certain elements of the equipment. A series of visual or audible indicators are used to alert the operator as to the condition of certain transport elements and sub-systems so that the operator will know in advance when it is safe to activate the manual controls to effect cassette movement.

According to one aspect of the invention, an interlock system is provided for use in a semiconductor fabrication operation of the type including a stage for holding and moving semiconductor devices between first and second staging positions, and a transport mechanism which includes an arm to transport the devices from a storage location onto a stage. The interlock system broadly comprises means for sensing the position of the transport arm and for producing a first signal indicative of the position of the arm; means for sensing the position of the stage and for producing the second signal indicative of the position of the stage; and control means responsive to the first and second control signals for controlling the transport mechanism and the stage, such that the movement of the arm and the stage are coordinated with each other so as to prevent an equipment collisions that may damage either the equipment or wafers. As noted above, visual indicators such as LEDs are employed to provide the operator with a visual indication revealing the readiness of either the arm or stage to carry out a safe transport operation. Additionally, lockout means are provided, operated by the control means, for preventing the operation of the transport arm except when the stage is in its home position, and a cassette is not already present on the stage. The interlock means preferably includes an electrically operated switch, such as an electrical relay, for selectively enabling the operation of the transport arm.

According to another aspect of the invention, apparatus is provided for transporting semiconductor devices from a first staging area to a second staging area which is operable both in an automatic and a manual mode. The apparatus broadly includes a wafer stage for staging wafers thereon; a wafer transport mechanism including a transporter arm for transporting wafers from the first to the second stage; and control means for controlling the operation of the wafer stage and the transport mechanism. The control means preferably includes programmed logic means for automatically controlling the operation of transport mechanism when the apparatus is in an automatic mode of operation, and manually operable means for controlling the operation of the transport mechanism when the apparatus is in a manual mode of operation. The apparatus further includes first sensing means for sensing the position of the transport arm and for delivering to the control means a first signal indicative of the position of the transport arm, and second sensing means for sensing the position of the stage and for delivering to the control means a second signal indicative of the position of the stage. Finally, the apparatus includes lock-out means operated by the control means when the apparatus is in the manual mode of operation thereof, which prevents the operation of the transport arm except when wafers are not on the stage and the stage is in its home position.

Accordingly, it is the primary object of the present invention to provide apparatus for transporting semiconductor wafers which includes a lock-out system that prevents damage to equipment or wafers as a result of equipment collisions when the equipment is being manually controlled by an operator.

Another object of the present invention is to provide apparatus as described above which provides the operator with an audible or visual signal alerting the operator to the status or position of each transport element so that the operator knows whether it is safe to initiate movement of a transport element.

A further object of the present invention is to provide apparatus as mentioned above which senses the position of the transport elements, which information is then used by a lockout system to prevent improper operation of the transport element.

A still further object of the present invention is to provide a lock-out system for a semiconductor wafer transport system which prevents equipment collision and damage, thereby increasing thru-put and wafer yield.

These, and further objects and advantages of the present invention will be made clear or will become apparent during the course of the following description of a preferred embodiment of the invention.

BRIEF DESCRIPTION OF THE DRAWINGS

In the drawings, which are to be read in conjunction with the present specification and appended claims, and wherein like reference numerals are used to designate identical components in the various views:

DETAILED DESCRIPTION OF THE PREFERRED EMBODIMENT

Figure 1:
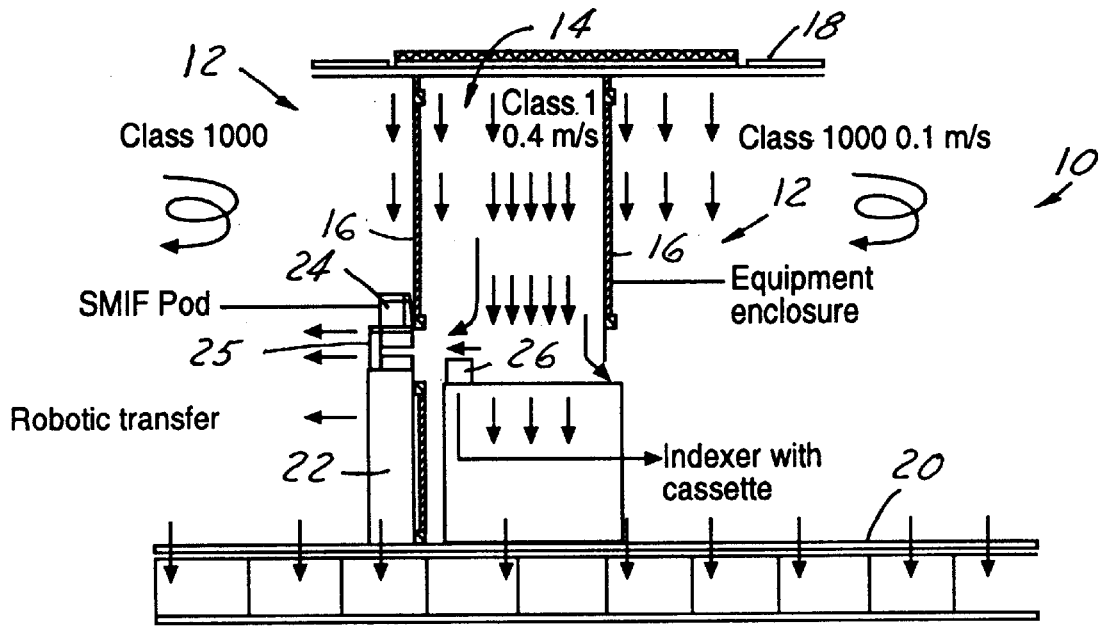
FIG. 1 is a diagrammatic, cross-sectional view of a clean room arrangement including a wafer transport apparatus employing the interlock system of the present invention.
Figure 2:
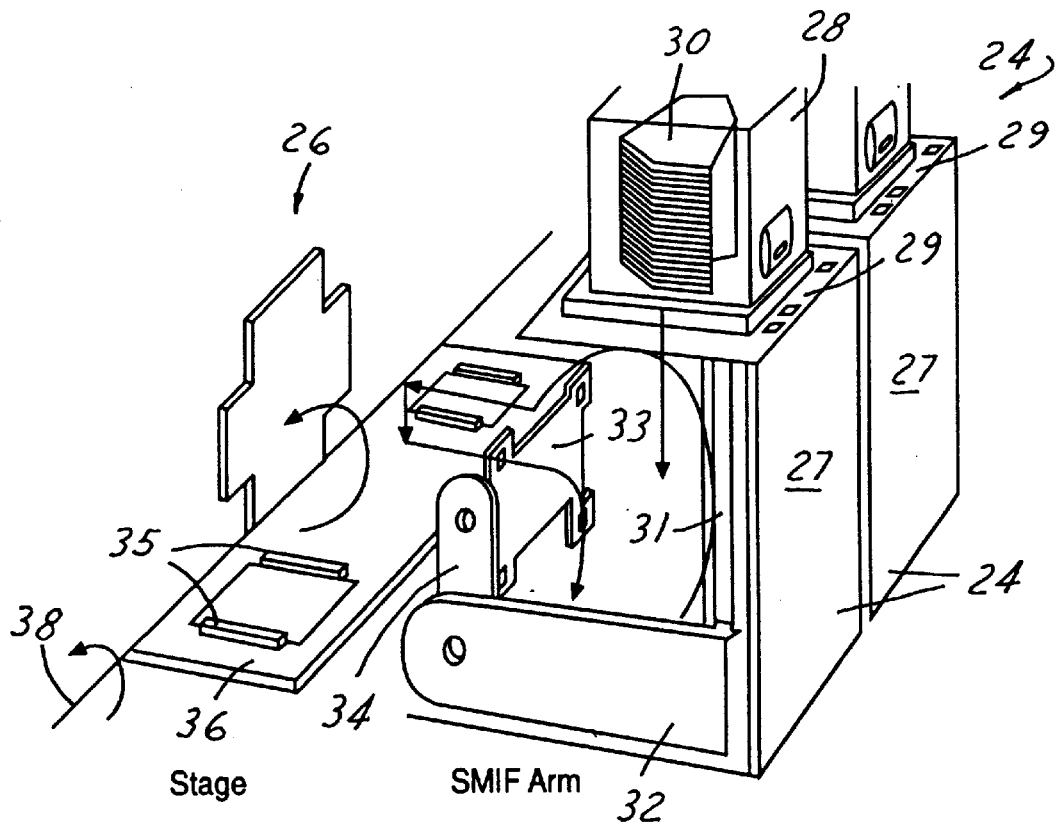
FIG. 2 is an enlarged, perspective view of the wafer handling equipment which employs the novel interlock system of the present invention.

Referring first to FIGS. 1 and 2, the present invention broadly relates to material handling equipment, and particularly a transport mechanism for moving semiconductor devices, such as wafers through various processing stations used to fabricate semiconductor devices. Such fabrication processes are normally conducted in a clean room, broadly indicated by the numeral 10 which may be partitioned into one or more areas respectively possessing differing levels of cleanliness. For example, clean room 12 is defined by a perforated ceiling 18 and floor 20 through which laminar air flows. A mini-clean room environment 14 within room 12 is defined by partition walls 16 so that the mini clean room environment 14 possesses a cleanliness level greater than that of the surrounding area within the clean room 12. For example, the mini-clean room environment 14 may be a Class 1, while the surrounding area outside of the partitioned walls 16 might be a Class 1000 clean room.

Along with the trend toward the use of sub-micron technologies, there is an increasing need for cleanliness of the fabrication environment, particularly in and surrounding processing machines and the equipment used to transport wafers into and away from a processing machine or station. In the illustrated embodiment, one or more processing machines (not shown) are stationed within the mini-clean room environment 14. In order to transport wafers into the mini-clean room environment 14, standard mechanical interface (SMIF) pods 24 are employed, each of which holds one or more cassettes 28 containing a plurality of wafers 30. The pods 24 are moved by a robotic transfer system 22 through an opening 25 in the partition 16. Each of the pods 24 includes a set of later discussed mechanical arms which move the cassettes 28 through the opening 25 onto a cassette indexer 26, which in turn indexes the cassettes 28 to a processing machine or station (not shown) where a fabrication process is carried out on the wafers 30.

As best seen in FIG. 2, each of the SMIF pods 24 includes a back wall 27 and a top shelf 29 upon which there is supported one of the cassettes 28 containing a plurality of wafers 30. A pair of laterally spaced arms 32 are mounted for vertical sliding movement on guides 31. A second pair of laterally spaced elongated arms 34 each has one end thereof pivotally connected to an outer extremity of a corresponding arm 32. Pivotally connected between the outer extremities of arms 34 there is provided a cassette-supporting tray 33. As will be described below, the SMIF pod 24 transfers cassettes 28 onto a stage 36, and more particularly to a position on the stage 36 between a pair of registration stops 35. The stage 36, which in the illustrated embodiment would form part of the indexer 26, is mounted for pivotal movement about an axis 38 in order to move the cassettes 28 toward a processing machine or station within the mini-clean room environment 14.

As will be discussed below, the operation of each of the pods 24 and the stage 36 is carried out under automatic control by a programmed computer or programmable logic controller, which transports and indexes the cassettes 28 completely automatically, normally without operator intervention. Each of the pods 24 is moved by the robotic transfer system 22 to a staging area, immediately adjacent the opening 25. Once indexed to the staging position, the arms 32 move upwardly while arms 34 move rearwardly and a tray 33 is pivoted to a horizontal position, in readiness to pick up a cassette 28, this position of readiness may be referred to as the home position. When it is desired to transfer a cassette 28 to the stage 36, the tray 33 moves upwardly to engage a cassette 28, arms 32 move downwardly while arms 34 pivot outwardly, and tray 33 is pivoted so as to remain in a horizontal position. This sequence of operations moves the cassette 28 onto the stage 36, whereupon the tray 33 releases the cassette 28 and both the tray 33 and arms 34 return to their normal home or stand-by position. With the cassette 28 having been delivered to the stage 36, the stage 36 is then pivoted about axis 38 to move the cassette 28 to a processing machine or station, for further processing.

In a variety of circumstances, it is sometime necessary to operate the above-described wafer handling equipment in an off-line mode, wherein an operator controls the movement of each element of the transfer mechanism separately. Whereas in the on-line, automatic mode of operation the operation of the various movable elements of the equipment are precisely synchronized with each other, such is not the case when the equipment is operated off-line. Thus, in the off-line mode it is possible to move the mechanical elements of the system in a manner which results in collision of such elements, and consequent damage to either the mechanical elements or to the wafers. The present invention provides a novel interlock system which not only prevents mechanical collision during direct operator control, but also provides prompting to the operator so that the operator will know when and in what order to actuate individual elements of the transport system.

Figure 3:
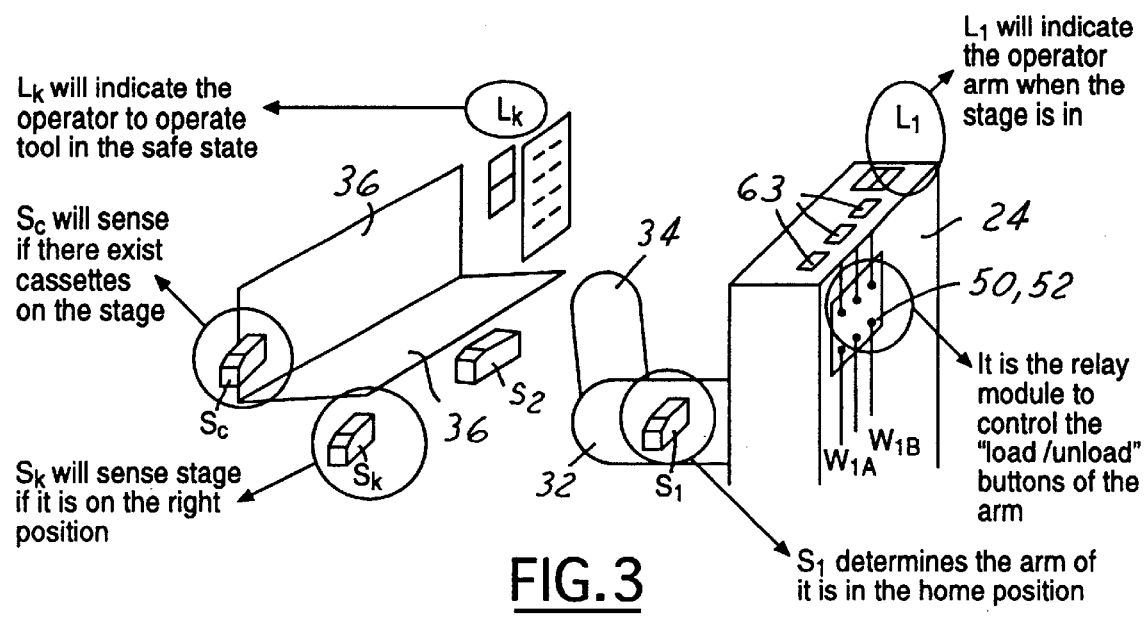
FIG. 3 is a diagrammatic, perspective view of the equipment shown in FIG. 2 but depicting in more detail the specific elements of the lockout system; and, FIG. 4 is a combined block and schematic diagram of the lockout system which forms the preferred embodiment of the invention.
Figure 4:
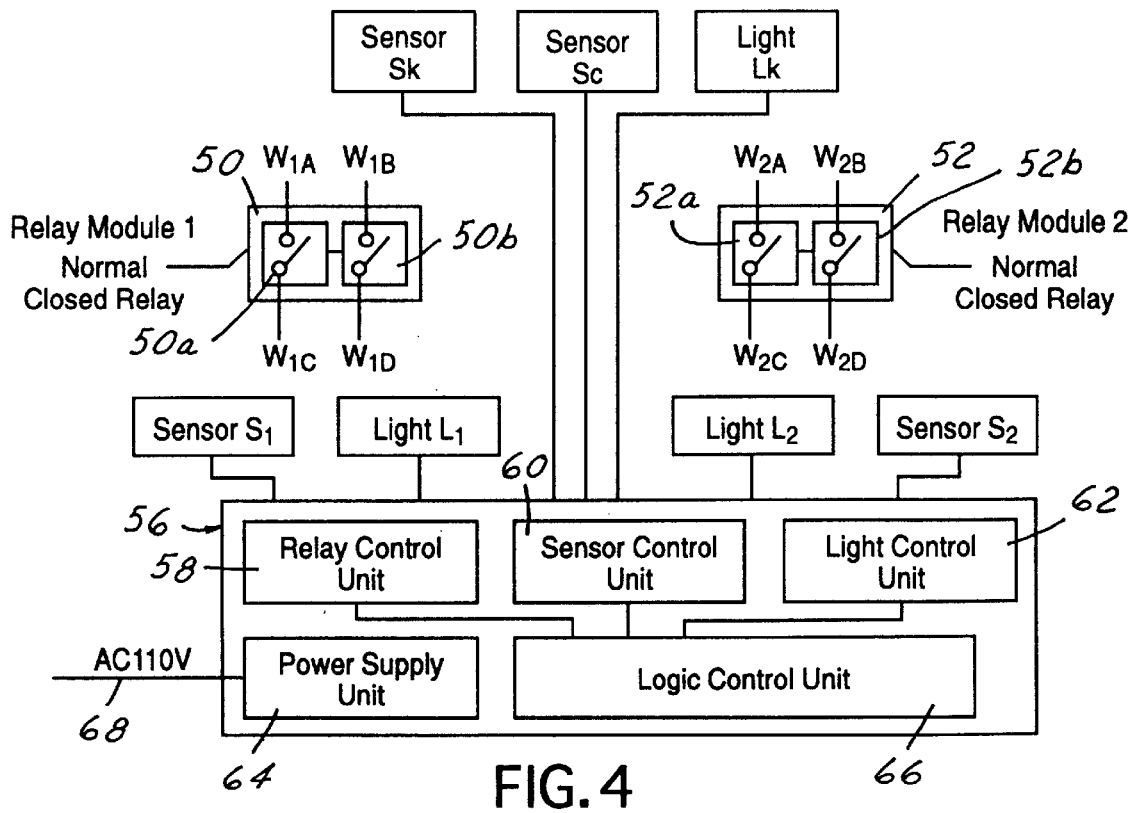

The essential elements of the interlock system are shown in FIGS. 3 and 4. A sensor $S_1$ is provided to sense the position of arm 32. Sensor $S_1$ produces an output signal when the arm 32 is in its home position. A second sensor $S_K$ is provided to sense when the stage 36 is in its normal, horizontal home position, ready to accept the transfer of a cassette 28 from one of the pods 24. A third sensor $S_2$ senses when the arms 34 are in their normal standby or home position. Finally, a fourth sensor $S_C$ is provided to sense when a cassette 28 is present on the stage 36. The above-described sensors may comprise conventional, commercial devices using any of various contact or non-contact technologies such as an infrared beam of light.

The interlock system further includes a series of visual indicators preferably in the form of LEDs $L_1$, $L_2$ and $L_K$, all of which LEDs are mounted on or near a control panel 56 so that the operator can readily view them while manually controlling the transport system. LED $L_1$ provides an indication to the operator as to whether the stage 36 is in its home position, in readiness to receive a cassette 28. If there are no cassettes 28 present on the stage 36, LED $L_1$ will display a green color. LED $L_K$ provides the operator with an indication of whether the arms 32, 34 are in their home position, thus indicating that such arms are clear from the stage 36, and it is safe to rotate the stage 36 in order to transfer one of the cassettes 28. In the event that there is a cassette 28 on a stage 36, LED $L_2$ will be illuminated yellow to indicate that it is not safe to operate the pods 24 to transfer another cassette; conversely, when $L_2$ is green, it is safe to transfer a cassette from the pod 24.

Referring now to particularly FIG. 4, the controller 56 includes a conventional logic control unit 66 which typically will comprise a PLC (Programable Logic Controller) provided with a set of programmed instructions, a light control unit 62, a sensor control unit 60, a relay control unit 58, and a power supply unit 64 coupled with a source of AC power 68. The controller 56 receives control signals from each of the sensors $S_1$, $S_2$, $S_K$ and $S_C$. LEDs $L_1$, $L_2$ and $L_K$ are controlled by output signals from the controller 56. The relay control unit controls a pair of relay modules 50, 52, each of which includes two normally closed relays, 50a, 50b and 52a, 52b. Relay 50a switches a pair of lines $W_{1A}$ and $W_{1C}$. Relay 50b switches a pair of lines $W_{1B}$ and $W_{1D}$. Relay 52a switches a pair of lines $W_{2A}$ and $W_{2C}$. Finally, relay 52b switches a pair of lines $W_{2B}$ and $W_{2D}$. Relays 50a and 52a are operated by a "load" button or switch 63 forming part of the controller 56 and manually operated by the operator to initiate the loading of a cassette 28 from the pod 24 onto the stage 36. Relay 50b, 52b are coupled with a second button or switch forming part of the controller 56 which is manually operated by the operator to initiate unloading or retraction of the arms 33, 34 after a cassette 28 has been loaded onto the stage 36. The relay modules 50, 52 are preferably incorporated into the controller 56. When the stage 56 is in its normal, home position and is free of cassettes 28, the logic control unit 66 possesses logic circuitry which enables the above mentioned load and unload buttons which in turn close relays 50a and 52a. In other words, when sensor $S_K$ senses that the stage 36 is in its normal horizontal, home position and sensor $S_C$ senses that there are no cassettes 28 present on the stage 36, the load and unload buttons 63 are enabled to be manually operated by the operator. If, however, sensor $S_K$ senses that the stage 36 is not in its home position, or if sensor $S_C$ senses that a cassette is still present on the stage 36, then the load and unload buttons are not enabled, i.e. actuation of either of these buttons will not result in closure of the relays 50a 52a. The controller 56 further includes a "continue" button or switch manually operated by the operator which controls a motor that rotates the stage 36 to transfer a cassette 28. The logic of the logic control unit 66 locks-out operation of the "continue" button unless sensors $S_1$ and $S_2$ and the arms 33, 34 are in their home positions, and thus clear of the stage 36. Further, the readiness of the stage 36 to be rotated will be indicated by the LED $L_K$.

The control logic employed by the controller 56, and the operation of the interlock system is further illustrated by the following logic statements:

IF $S_1$=ON and $S_2$=ON THEN $L_K$=ON ELSE $L_K$=OFF

IF $S_K$=ON THEN $I_F$ $S_C$=ON $L_1$=ON (Green), $L_2$=ON (Green)

$W_{1A}$=ON, $W_{2A}$=ON $W_{1B}$=N, $W_{2B}$=ON

ELSE $L_1$=ON (Yellow), $L_2$=ON (Yellow)

$W_{1A}$=OFF, $W_{2A}$=OFF $W_{1B}$=ON, $W_{2b}$=ON

ELSE

Li=OFF, $L_2$=OFF $W_{1A}$=OFF, $W_{2A}$=OFF $W_{1B}$=OFF, $W_{2B}$=OFF

From the foregoing description, it is apparent that the interlock system described above not only provides for the reliable accomplishment the objects of the invention but does so in a particularly effective and economical manner. It is recognized, of course, that those skilled in the art may make various modifications or additions to the preferred embodiment chosen to illustrate the invention, without departing from the spirit and scope of the present contribution to the art. Accordingly, it is to be understood that the protection sought and to be afforded hereby should be deemed to extend to the subject matter claimed and all equivalent thereof fairly within the scope of the invention.

What is claimed is:

1. Apparatus for transporting semiconductor wafers from a first storage area to a second staging area and operable in both automatic and manual modes, comprising:

a wafer stage at said second area for staging said wafers thereon, said wafer stage being shiftable from a home position to an operated position whereby said wafers on said stage are moved away from said staging area;

a wafer transport mechanism at said first stage area, said transport mechanism having a transport arm movable from a home position to transport said wafers from a wafer storage area onto said stage;

control means for controlling the operation of said wafer stage and said transport mechanism, said control means including:

(i) programmed logic means for automatically controlling the operation of said transport mechanism and said stage when said apparatus is in said automatic mode of operation, and (ii) manually operable means for controlling the operation of said transport mechanism and said stage when said apparatus is in said manual mode of operation;

first sensing means for sensing the location of said transport arm and for delivering to said control means said first signal indicative of the position of said transport arm;

second sensing means for sensing the position of said stage and for delivering to said control means said second signal indicative of the position of said stage; and lockout means operated by said control means when said apparatus is in said manual mode of operation for preventing the operation of said transport arm except when wafers are not on said stage and said stage is in said home position thereof.

2. The apparatus of claim 1, including third sensing means for sensing the presence of wafers on said stage and delivering a third signal indicative of the presence of said wafers on said stage.

3. The apparatus of claim 1, including first visual indicator means operated by said control means when said apparatus is in said manual mode of operation, for providing a visual indication confirming that said arm is in said home position thereof.

4. The apparatus of claim 3, including second visual indicator means operated by said control means when said apparatus is in said manual mode of operation, for providing a visual indication of the position of said stage.

5. The apparatus of claim 1, wherein said lockout means includes electrically operated switch means responsive to said control means for selectively disabling said manually operable control means, whereby to prevent operation of said transport mechanism.

6. The apparatus of claim 5 where said switch means includes normally close relay means.

7. The apparatus of claim 2 wherein said lockout means includes first and second electrically operated switches means responsive to said control means for respectively disabling the operation of said stage and transport mechanism.

8. The apparatus of claim 7 wherein each of said switch means includes normally closed relay means.

* * * * *